(12) United States Patent
Bettencourt et al.

(10) Patent No.: US 9,419,083 B2
(45) Date of Patent: Aug. 16, 2016

(54) SEMICONDUCTOR STRUCTURES HAVING A GATE FIELD PLATE AND METHODS FOR FORMING SUCH STRUCTURE

(71) Applicant: Raytheon Company, Waltham, MA (US)

(72) Inventors: John P. Bettencourt, Danvers, MA (US); Eduardo M. Chumbes, Andover, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/550,557

(22) Filed: Nov. 21, 2014

(65) Prior Publication Data

US 2016/0149006 A1    May 26, 2016

(51) Int. Cl.
*H01L 21/338* (2006.01)
*H01L 29/40* (2006.01)
*H01L 29/812* (2006.01)
*H01L 29/66* (2006.01)
*H01L 21/28* (2006.01)

(52) U.S. Cl.
CPC ........ *H01L 29/402* (2013.01); *H01L 21/28026* (2013.01); *H01L 29/401* (2013.01); *H01L 29/66848* (2013.01); *H01L 29/812* (2013.01)

(58) Field of Classification Search
CPC ............ H01L 29/66431; H01L 29/778; H01L 21/28026; H01L 29/66848
USPC .......................................... 438/172; 257/409
See application file for complete search history.

(56) References Cited

U.S. PATENT DOCUMENTS

| | | | | |
|---|---|---|---|---|
| 5,384,479 A | * | 1/1995 | Taniguchi | ......... H01L 21/28079 257/383 |
| 5,885,860 A | * | 3/1999 | Weitzel | ............... H01L 21/0445 257/E21.054 |
| 6,255,202 B1 | * | 7/2001 | Lyons | ............... H01L 21/28114 257/E21.205 |
| 6,483,135 B1 | * | 11/2002 | Mizuta | ................... H01L 29/402 257/283 |
| 7,662,698 B2 | | 2/2010 | Tabatabaie | |
| 7,897,446 B2 | | 3/2011 | Smorchkova et al. | |
| 2008/0128752 A1 | | 6/2008 | Wu | |
| 2013/0146944 A1 | * | 6/2013 | Yoon | ................. H01L 21/28593 257/192 |
| 2013/0252386 A1 | | 9/2013 | Sheppard et al. | |
| 2014/0097471 A1 | * | 4/2014 | Briere | ................... H01L 29/402 257/194 |

\* cited by examiner

*Primary Examiner* — Caridad Everhart
(74) *Attorney, Agent, or Firm* — Daly, Crowley, Mofford & Durkee, LLP

(57) ABSTRACT

A field effect transistor structure having a semiconductor having a source region, a drain region, and a gate contact region disposed between the source region and the drain region; and a gate electrode having a stem section extending from a top section of the gate electrode to, and in Schottky contact with, the gate contact region. The stem section has an upper portion terminating at the top portion of the gate electrode and a bottom portion narrower than the upper portion, the bottom portion terminating at the gate contact region. The bottom portion of the stem has a step between the upper portion of the stem section and the bottom portion of the stem section in only one side of the stem section. The step of the stem section provides an asymmetric field plate for the field effect transistor.

7 Claims, 6 Drawing Sheets

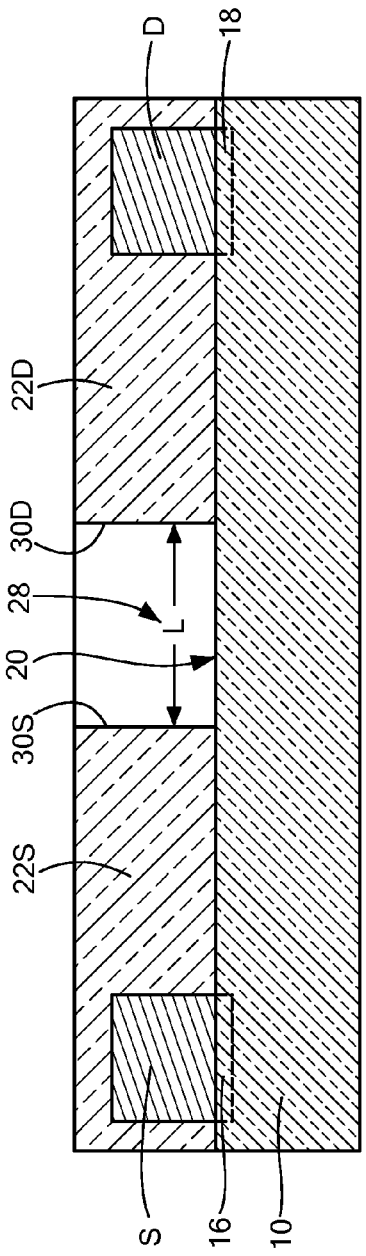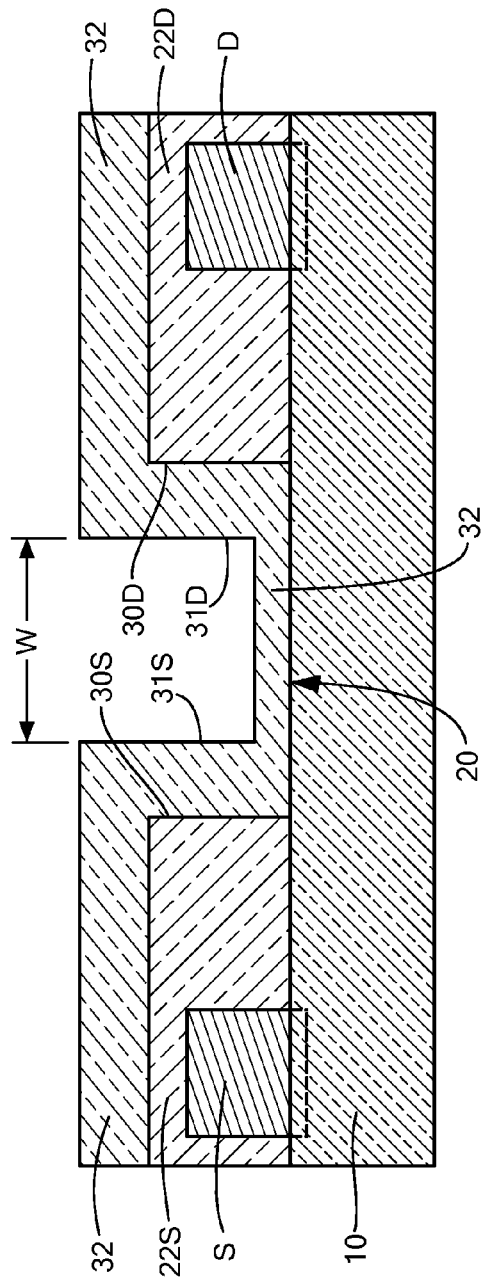

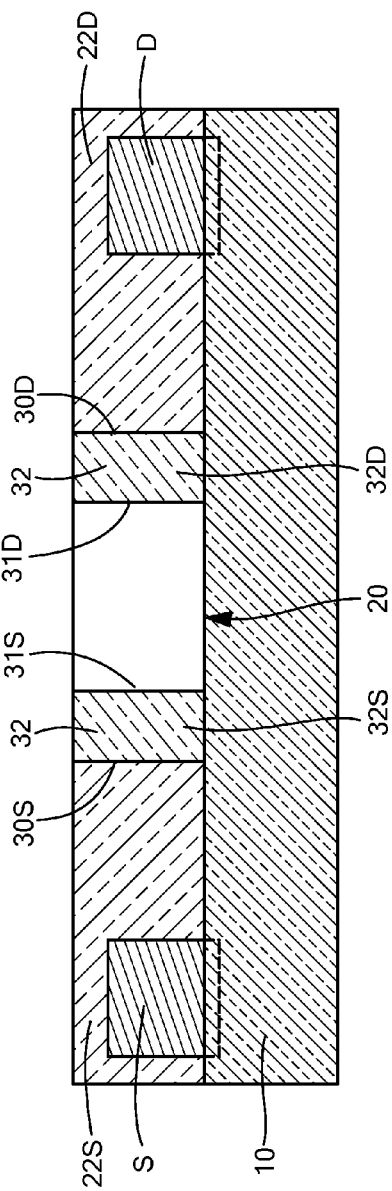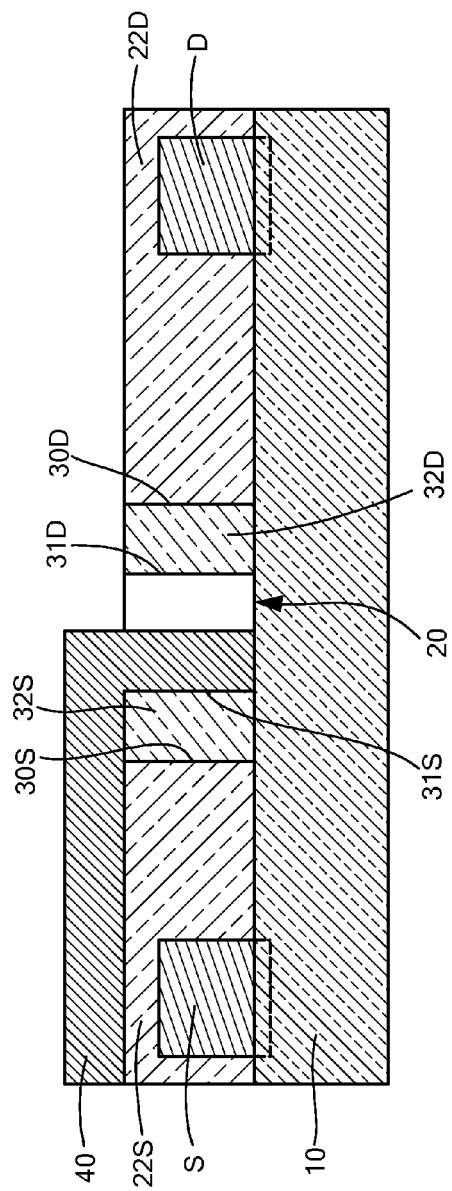

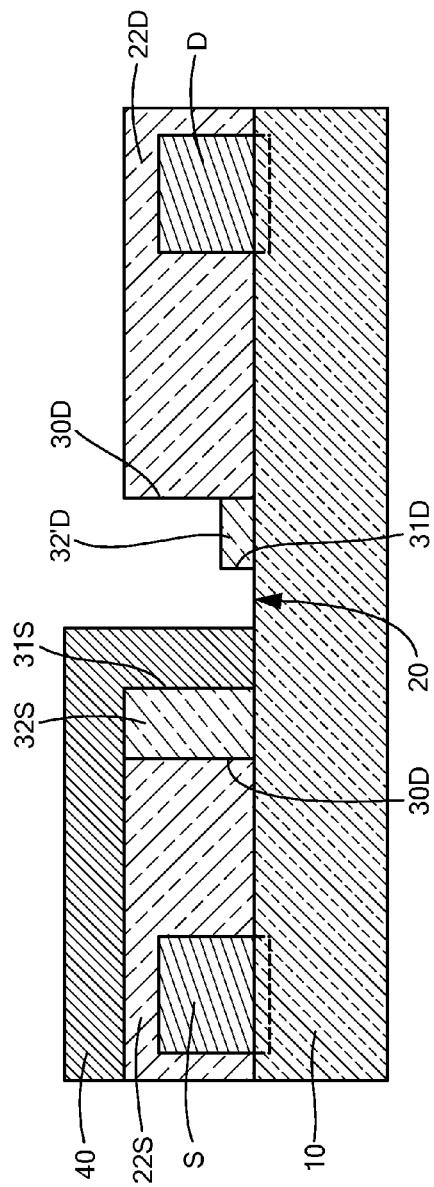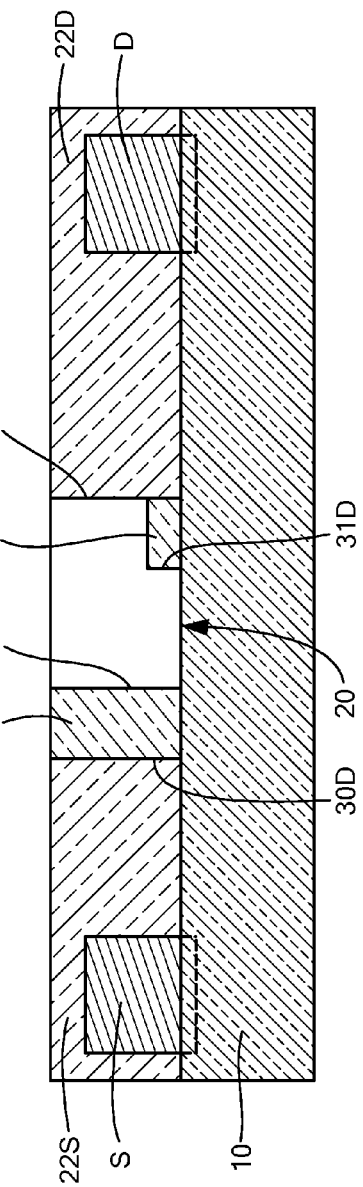

SEMICONDUCTOR STRUCTURES HAVING A GATE FIELD PLATE AND METHODS FOR FORMING SUCH STRUCTURE

TECHNICAL FIELD

This disclosure relates generally to semiconductor structures having gate field plates and methods for forming such structures and more particularly to semiconductor structures having gate field plates and methods for forming such structures.

BACKGROUND

As is known in the art, scaling traditional semiconductor field-effect transistors (FETs) like modulation-doped FETs (MODFETs) or high electron mobility transistors (HEMTs) having very short channel and gate length spacings in the sub-micron range below 0.1 um to maximize gain performance at microwave, millimeter and THz frequencies leads to significant large peak electric field under the gate electrode on the drain side that lowers breakdown voltages. This undesired tradeoff between frequency performance and device breakdown limits the transistor's overall RP power and efficiency performance.

In recent years, field plates are becoming a common addition to these transistors to reduce the peak electric field to enhance breakdown thus providing a means to alleviate the performance tradeoff just described. These field plates have taken on several forms as either a fourth electrode placed between the gate and drain or integrated as an extension of the gate electrode on the drain side or both. Typical dimensions of the field plates range depending on application from a few microns or tenths of microns to tens of microns. In this range, however additional parasitic capacitances are added that detrimentally impacts gain performance yielding little benefit for high frequency transistors.

One type of field plate structure is described in U.S. Pat. No. 7,662,698, entitled "Transistor having field plate", inventor Tabatabaie, assigned to the same assignee as the present invention. Another type of field pate is formed by extending one side of the top of a mushroom shaped, sometimes referred as a T-shaped gate as shown in U.S. Published Patent Application Nos. U.S. 2008/0128752 and U.S. 2013/0252386. The above-described field plate structure is asymmetric in that the field, plate is extended over only one side of the gate. Another type of field plate is described in U.S. Pat. Nos. 7,750,370 and 7,897,446. As described therein an electron beam (e-beam) lithography (EBL) resist layer is formed on the source-drain metallizations and a protective dielectric layer. Electron Beam Lithography (EBL) is applied to the resist layer to fern a resist opening having a profile in which the width is comparatively narrow in a lower portion and comparatively greater in an upper portion. Alternatively, a self-supporting mask can be used with a flood electron gun source which provides a collimated beam of electrons. The mask can then be imaged directly on the resist layer to thereby form the window. Alternatively, electron beam lithography utilizing bi-layers of various resists can be used for the patterning process. A predetermined portion of the protective dielectric layer is completely or partially etched via the resist opening to form a window in the protective dielectric layer. An anisotropic dry etch is preferably used so that the resist layer and the predetermined portion of the protective dielectric layer are etched vertically while the lateral etch rates of both layers remain negligible. The final size of window is therefore very close to the original (pre-etch) size of the resist opening in its lower portion. The resist opening is widened so that a width of a lower portion of the resist is opening is greater than a width of the window in the protective dielectric layer. The widening can be achieved by performing a post-etch oxygen plasma etch on the resist opening so that only the resist opening is widened while a width of the window in the protective dielectric layer is not substantially effected. Widening the resist opening with respect to the window permits formation of miniature wings on both sides of the T-gate. The wing on the drain side of the gate can serve as a miniature gate-connected field mitigating plate. Here, the field plate is formed at the bottom of the stem of the T-shaped gate using e-beam lithography, which has well-known disadvantages of slow throughput and increased complexity making this approach expensive and less desirable for high yield/volume manufacture. Further, the method used to form the field plate results in a symmetrical field, plate that extends on both sides of the gate, which is unnecessary as the necessary electric field reduction for breakdown enhancement is only on the drain side of the gate. Having a field plate on the source side contributes additional gate-source parasitic capacitance thereby impacting gain performance.

Shrinking field plates into the nanometer scale dimensions reduce these parasitics while still providing the necessary field-reduction required to enhance device breakdown. However, their fabrication through traditional liftoff processes and lithographic techniques (e.g. optical or electron beam at the manufacturing scale with high reproducibility and yield are difficult given the small dimensions and critical placements involved.

SUMMARY

In accordance with the present disclosure, a field effect transistor structure, is provided having: a semiconductor having a source region, a drain region, and a gate contract region disposed between the source region and the drain region; and a gate electrode having a stem section extending from a top section of the gate electrode to, and in Schottky contact with, the gate contract region. The stem section has an upper portion terminating at the top portion of the gate electrode and a bottom portion narrower than the upper portion, the bottom portion terminating at the gate contact region. The bottom portion of the stem has a step between the upper portion of the stem section and the bottom portion of the stem section in only one side of the stem section.

In one embodiment the gate is a mushroom or T-shaped gate.

In one embodiment, field effect transistor structure includes a pair of dielectric spacers disposed on sides of the stem section, one of the pair of dielectric spacers being shorter than the other one of the dielectric spacers.

In one embodiment, the shorter one of the dielectric spacers is disposed in the step.

With such structure, the step of the stem section provides a buried, asymmetric field plate for the field effect transistor.

In one embodiment, a method is provided for limning a field effect transistor structure. The method includes: forming an opening in a first dielectric layer disposed on a surface of a semiconductor to form a first portion of the first dielectric layer over a source region of the an a laterally spaced portion of the first dielectric layer over a drain region of the semiconductor to expose a gate region of the semiconductor between the source region and the drain region; forming a pair of dielectric sidewall spacers on sidewalls of the opening with a portion of the gate region remaining exposed; selectively removing an upper portion of only one of the pair of dielectric sidewall spacers wherein one of the pair of sidewall spacers is shorter that the other one of the pair of sidewall spacers; and forming is gate electrode in Schottky contact with the exposed gate region, the gate electrode having a bottom portion extending laterally between sides of the shorter one of the pair of dielectric sidewall spacers and the other one of the pair of sidewall spacers.

In one embodiment, a field plate is formed for a field effect transistor, comprising: forming a first dielectric layer over spaced source and drain electrodes and over is gate region portion of a surface of a semiconductor disposed between the spaced source and drain electrodes; processing the first dielectric layer to form an opening passing between an upper surface portion of the first dielectric and through the first dielectric layer to expose the gate region portion of the surface of the semiconductor, the opening having a pair of spaced sidewalks allowed by the processed first dielectric layer; depositing a conformal dielectric material over surface portions of the processed first dielectric layer, over sidewalls portions of the processed first dielectric layer, and over the exposed gate region portion of the surface of the semiconductor. The conformal dielectric material has a higher etch rate than the etch rate of the first dielectric material to an anisotropic plasma etch. The conformal dielectric material is processed into a pair of dielectric sidewall spacers on the sidewalls of the opening with a portion of the gate region remaining exposed. An anisotropic plasma etch is applied to the deposited conformal dielectric material to selectively remove the upper surface portions of the conformal dielectric material exposing underlying portions of the first dielectric layer; and selectively removing the conformal dielectric layer over the gate region portion of the surface of the semiconductor exposing the gate region portion of the surface of the semiconductor; and leaving the conformal material over pair of spaced the sidewalls of the processed first dielectric layer to provide the pair of dielectric sidewall spacers. A mask is lithographically formed over only the source region portion and a first one of the pair dielectric sidewall spacers while exposing the drain region portion and a second one of the pair dielectric sidewall spacers. A plasma etch is applied to the mask to electrically remove an upper portion of only the second one of the pair of dielectric sidewall spacers while leaving unetched both a lower portion of the second one of the pair of dielectric sidewall spacers and the first one of the pair of dielectric sidewall spacers. The mask is removed. A gate electrode is formed with additional lithography metal deposition etch and lift off steps having a portion on the lower portion of the second one of the pair of dielectric spacers to provide a step in only one side of a stem portion of the gate, the step providing the field plate for the transistor.

With such method, the upper portion of the stem provides an asymmetric field plate for the field effect transistor.

In one embodiment a method is provided for forming a field plate for a field effect transistor. The method includes: firming a first dielectric layer over spaced source and drain electrodes and over a gate region portion of a surface of a semiconductor disposed between the spaced source and drain electrodes; processing the first dielectric layer to form an opening passing between an upper surface portion of the first dielectric and through the first dielectric layer to expose the gate region portion of the surface of the semiconductor, the opening having a pair of spaced sidewalls allowed by the processed first dielectric layer; depositing a conformal dielectric material over upper surface portions of the processed first dielectric layer, over sidewalls portions of the processed first dielectric layer, and over the exposed gate region portion of the surface of the semiconductor. The conformal dielectric material has a higher etch rate than the etch rate of the first dielectric material to a predetermined anisotropic plasma etch. The method includes patterning the conformal dielectric material into a pair of dielectric sidewall spacers on the sidewalls of the opening with a portion of the gate region remaining exposed comprising; applying the predetermined anisotropic plasma etch to the deposited conformal dielectric material to selectively remove the upper surface portions of the conformal dielectric material exposing underlying portions of the first dielectric layer; and selectively removing the conformal dielectric layer over the gate region portion of the surface of the semiconductor exposing the gate region portion of the surface of the semiconductor; and leaving the conformal material over pair of spaced the sidewalls of the processed first dielectric layer to provide the pair of dielectric sidewall spacers. The method includes: photolithographically forming a mask over only the source region portion and a first one of the pair dielectric sidewall spacers while exposing the drain region portion and a second one of the pair dielectric sidewall spacers; applying a dry etch to the mask to selectively remove an upper portion of only the second one of the pair of dielectric sidewall spacers while leaving unetched both a lower portion of the second one of the pair of dielectric sidewall spacers and the first one of the pair of dielectric sidewall spacers; removing the mask; and forming a mushroom- or T-shaped gate electrode having a portion on the lower portion of the second one of the pair of dielectric spacers to provide a step in only one side of a stem portion of the gate, the step providing the field plate for the transistor.

With such method, standard optical lithographic technique may be used to form a sub-micron Schottky gate contact with the nanometer-sized embedded field plate thus providing the necessary field reduction to enhance transistor breakdown while minimally adding parasitic capacitances to negligibly impact frequency performance.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 1A-1K show a field effect transistor of FIG. 1K at various steps in the fabrication thereof in accordance with the present disclosure.

Like reference symbols in the various drawings indicate like elements.

DETAILED DESCRIPTION

Figure 1A:
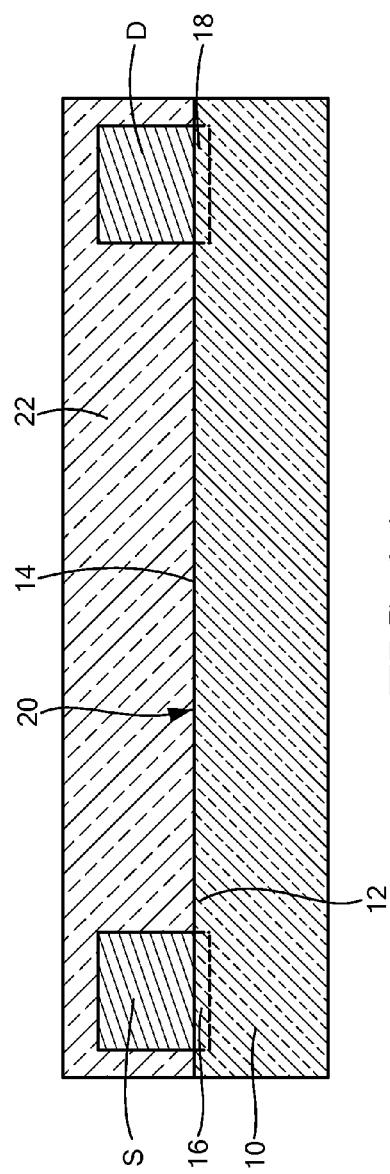

Referring now to FIG. 1A, a semiconductor 10, here includes a heterojunction Group III-V (for example, GaN/AlGaN) semiconductor 10, which may include a combination of semiconductor barrier, buffer or channel layers, not shown. The upper surface 14 of the semiconductor 10 has conventional laterally spaced source and drain electrodes, S and D, respectively, in ohmic contact with laterally spaced source and drain regions 16, 18, below, as indicated, with a gate region 20 disposed on the surface 14 between the source and drain regions 16, 18, as indicated.

A first dielectric layer 22, here for example silicon nitride deposited for example, by plasma enhanced chemical vapor deposition (PECVD), MBE, MOCVD or LPCVD on the surface of the semiconductor 10; more particularly, over the source and drain electrodes S, D and over a gate region 20, as indicated.

Figure 1B:
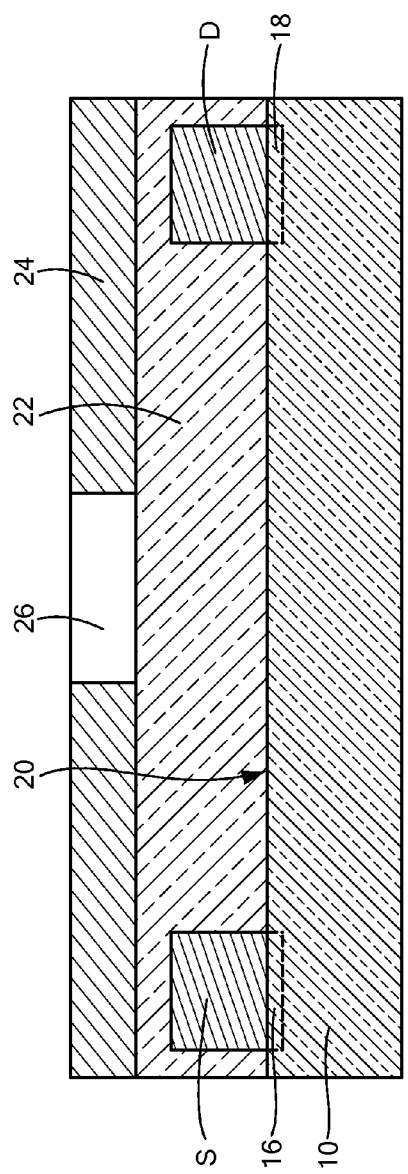

Referring now to FIG. 1B, next a mask 24, here using conventional optical photolithography resists, is applied to form an opening or window 26 therein with the opening 26 exposing an underlying portion of the first dielectric layer 22 disposed over the gate region 20, as shown. Next, a predetermined anisotropic plasma etch, here for example a fluorine containing etchant such as $SF_6$, or $CF_4$ is used to etch an opening or window 28 (FIG. 1C) through the exposed underlying portion of the first dielectric layer 20 to thereby expose an underlying portion of the gate region 20. Here, as noted above, the etchant contains fluorine and the etching conditions are adjusted to be an anisotropic etching process. It is noted that the forming an opening 28 in a first dielectric layer 20 separates the first dielectric layer 22 into a first portion 22S over the source region 16 and source electrode and a laterally spaced second portion 22D over a drain region 18 and drain electrode D. It is also noted that as a result of the etching, the opening 28 has a pair of spaced sidewalls 30S and 30D, respectively; a sidewall 30S being on a side portion of the first portion 22S of the first dielectric layer 22 and a sidewall 30D on a side portion of the second portion 22D of the first dielectric layer 22, as shown. It is noted that the separation L between the sidewalls 30S and 30D is here for in a range of 0.3 to 1.0 microns, here for example 0.5 microns. The mask 24 is removed leaving the structure shown in FIG. 1C.

Next, a conformal dielectric material 32, here for example, silicon nitride is uniformly deposited using PECVD over upper surface portions of the structure shown in FIG. 1D. It should be noted that the silicon nitride layer 32 is formed with a lower density than silicon nitride layer 22 so that layer 32 will have a higher etch rate than layer 22 when subjected to the same etchant, here for example, a fluorine containing plasma etchant, such as for example $SF_6$, or $CF_4$. This is achieved by adjusting the stoichiometry of silicon nitride during the PECVD process.

Thus, it is noted that the conformal dielectric material 32 is deposited over the first portion 22S of the first dielectric layer 22 the over the sidewall 30S, over the over the sidewall 30D and over the second portion 22D of the first dielectric layer 22, as shown in FIG. 1D. It should be noted that the conformal dielectric material 32 has a higher etch rate than the etch rate of the first dielectric material 22 to a predetermined etchant. It is also noted that the thickness of the conformal dielectric material 32 is selected so that the lateral width between the outer edges 31S, 31D are separated by a width W, here for example, 0.25 micrometers.

Next, the upper surface of the structure shown in FIG. 1D is subject to an anisotropic plasma etch. Again, for example, the fluorine containing etchant, such as $SF_6$, or $CF_4$. The etch rate of the conformal dielectric material 32 is at least twice faster than the etch rate of the first dielectric material 22. It is also noted that anisotopic plasma etching is a vertical etching process and therefore the etching process removes the portions of the conformal dielectric material 32 (FIG. 1D) on the upper surface of the first portion 22S of the first dielectric layer 22, on the upper surface of the second portion 22D of the first dielectric layer 22, and on the gate region 20, while leaving the portions of the conformal dielectric material 32 on the over the sidewall 30S and over the sidewall 30D, as shown in FIG. 1E. As will be described, the portions of the conformal dielectric material 32 remaining on the sidewall 30S, the portion indicated by the 32S, and the portion remaining on the sidewall 30D, the portion indicated by 32D, provide a pair of dielectric sidewall spacers in the process described below.

Next, referring to FIG. 1F, a mask 40 is formed over the surface of the structure shown in FIG. 1E. More specifically, mask 40 is formed using optical photolithographically to cover only the first portion 22S of the first dielectric layer 22, and the conformal material 32S on the sidewall 30S to thereby expose; the second portion 22D of the first dielectric layer 22; the conformal material 32D on the sidewall 30D, and a portion of the gate region 20, as shown.

Next, with the mask 40 applied as shown in FIG. 1F, a plasma etch, here for example, a fluorine based plasma etchant, such as $SF_6$, or $CF_4$ is applied to the surface of the structure with the mask 40 for a predetermined time. The etch rate of the conformal dielectric material 32 is substantially greater (by a factor of at least two times greater) than the etch rate of the first dielectric material 22. Thus, the etchant selectively removes an upper portion of the conformal material 32D on the exposed sidewall 30D while leaving both a lower portion 32'D of the conformal material 32 on the sidewall 30D and, because of the etch rate selectively, the second portion 22D of the first dielectric material 22 is not affected, as shown in FIG. 10. The mask 40 is removed leaving the structure shown in FIG. 1H.

Figure 1I:
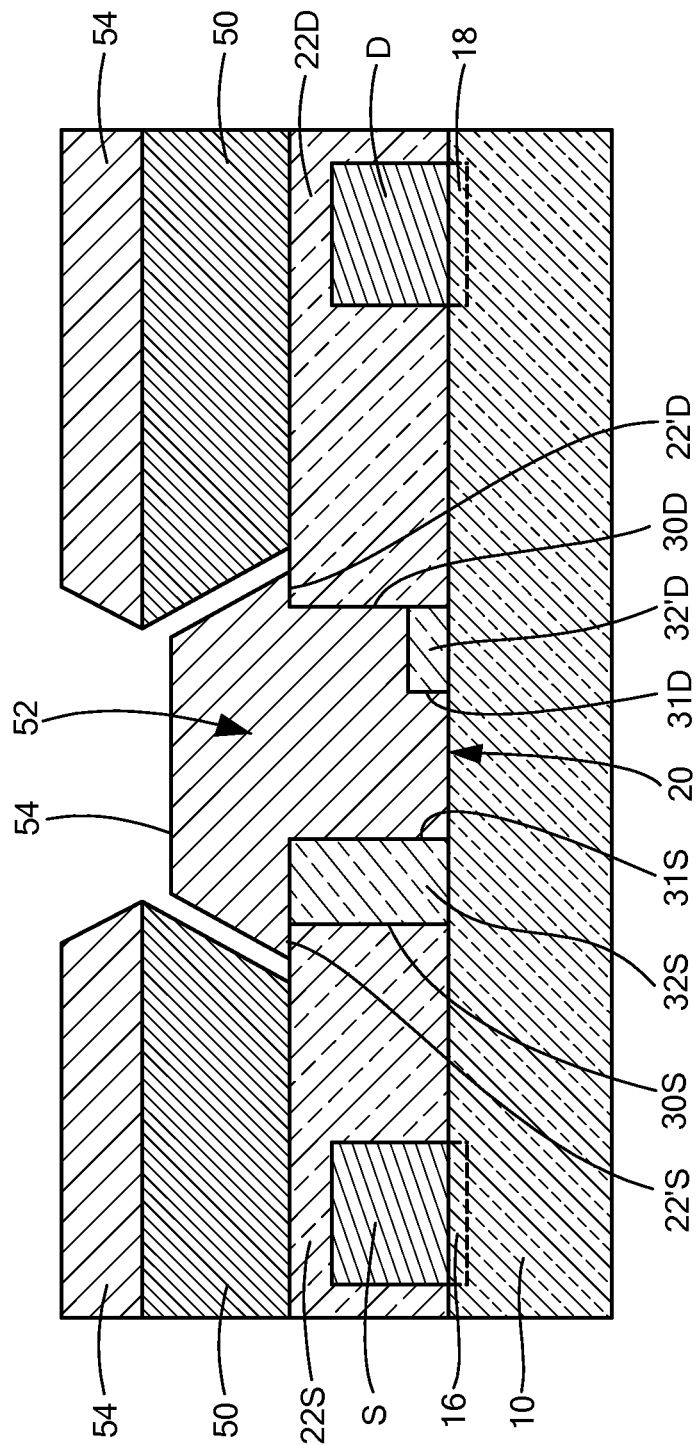

Next, the structure shown in FIG. 1H, is covered with a mask 50 having a window 52 formed therein using conventional optical photolithography. Here, the mask 50 material is a negative acting photoresist. The negative acting photoresist mask 50 patterning process therefore forms the window 52 with a retrograde that is the opening at the bottom of the window 52 is larger than the opening at the top of the window 52, exposing: surface portions 22'S of the first region 22S; the surface of conformal dielectric material 32S; the sidewall 31S; the gate region 20 disposed between the conformal dielectric material 32S on the sidewall 30S; the sidewall 31D; the top surface of 32'D; the upper sidewall of 30D; and surface 22'D, as shown in FIG. 1I.

Next, a metal 54, here for example, composite layers of nickel and gold are deposited, by electron beam evaporation over the mask 50. It is noted that portions of the metal 54 pass onto the surface of the mask 54 and through the window 52 onto the exposed surface portions 22'S of the first region 22S, the surface of conformal dielectric material 32S on the sidewall 30S, the gate region 20 disposed between the conformal dielectric material 32S on the sidewall 30S and the remaining lower portion 32'D of the conformal material 32D on the sidewall 30D; the side and upper surface of the remaining lower portion 32'D of the conformal dielectric material 32D on the sidewall 30D upper portion of sidewall 30D, and surface portions 22'D of the second region 22D, as shown in FIG. 1I. It is noted that the bottom of the metal is formed in Schottky contact with the gate region 20.

Figure 1J:
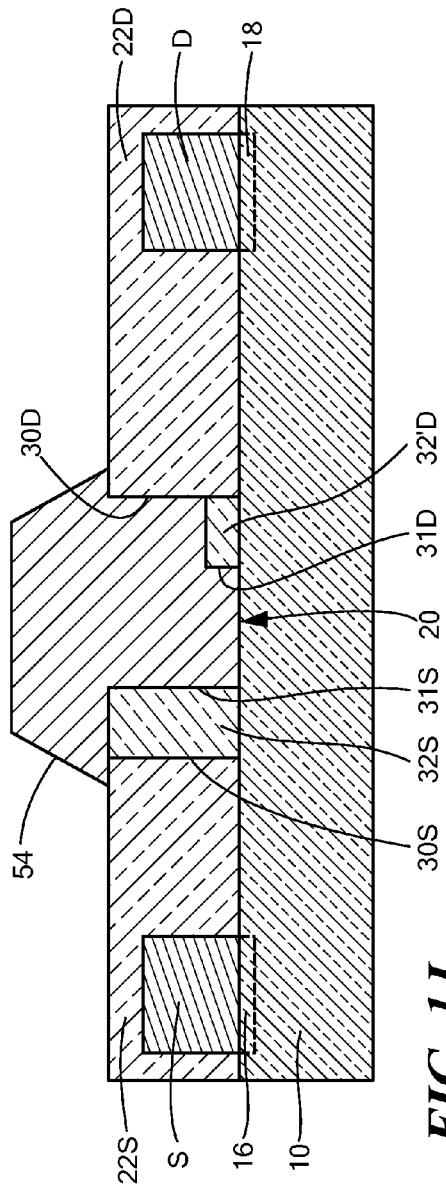

Next, the mask 50 is lifted off removing the portions of the metal 54 deposited onto the mask 50 leaving the structure shown in FIG. 1J. Next, openings 56S, 56D are formed in the first dielectric material 22 using an conventional process to expose the source and drain electrodes, S and D, as shown in FIG. 1K.

Figure 1K:
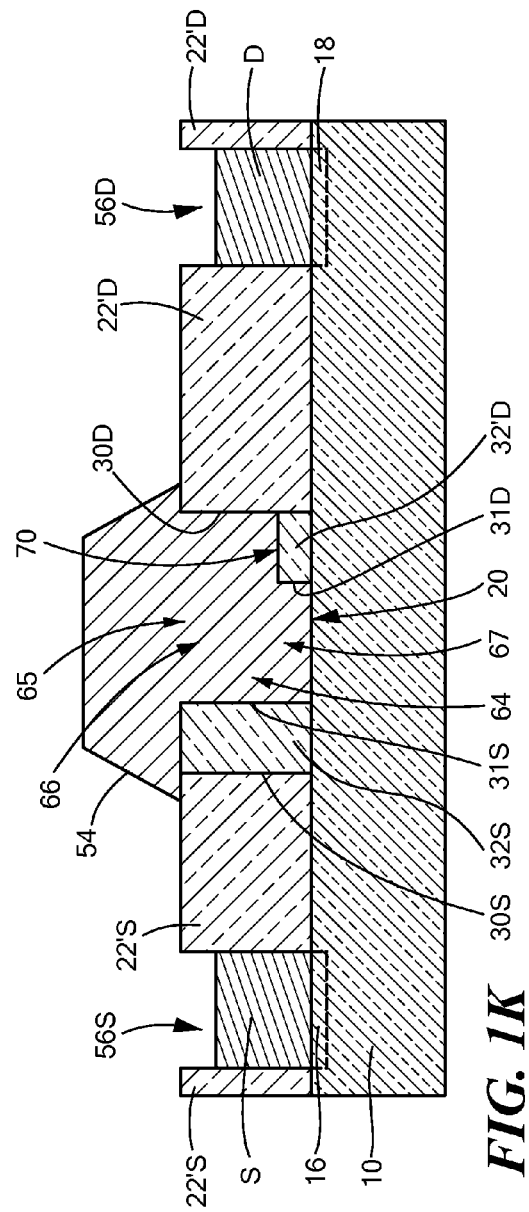

Thus, FIG. 1K shows a field effect transistor 60, having a semiconductor 10 having a source region 16, a drain region 18, and a gate contract region 20 disposed between the source region 16 and the drain region 18; and a mushroom- or T-shaped gate 66 having a stem section 64 extending from a top section 66 of the mushroom- or T-shaped gaze 66 to, and in Schottky contact with, the gate contract region 20. The stem section 64 has an upper portion 65 terminating at the top section of the mushroom- or T-shaped gate 66 and a bottom portion 67 terminating at and in Schottky contact with the gate contact region 20. The bottom portion 67 of the stem 64 has a step 70 between the upper portion 65 of the stem section 64 and the bottom portion 67 of the stem section 64 in only one side of the stem section 67. The conformal dielectric material 32 provides a pair of dielectric spacers 32S, 32'D disposed on sides of the stem section 64, one of the pair of dielectric spacers (the one formed by the dry etching; the conformal dielectric material 32"D) being shorter than the other one of the dielectric spacers (the one not dry etched; the conformal dielectric material 32S). The shorter one of the dielectric spacers 32D is disposed in the step 70. With such field effect transistor 60, the step 70 of the stem section 64 provides an asymmetric field plate for the field effect transistor 60.

It is noted that the sidewalls of the conformal dielectric material 32S, 32D provide a dielectric spacer 32S, 32D to realize the embedded field plate gate structure. The method produces, for example, a 250-nm gate. The height of the embedded field plate is determined by the height of the conformal dielectric material 32'D and is tailored by the time duration of the dry etching involved as described above in connection with FIG. 1G while its lateral dimension is tailored by thickness of the conformal dielectric material 32. It is noted that the first dielectric material 22 and conformal dielectric material 32 should (1) sufficiently passivate the semiconductor surface against surface-induced leakage and dispersion and (2) have, between the two dielectric, a high etch selectivity such that the conformal dielectric material 32 etches faster than the first dielectric layer 22 to the same etchant.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A field effect transistor structure, comprising:
a semiconductor having a source region, a drain region, and a gate contact region disposed between the source region and the drain region;
a gate electrode having a stem section extending from a top section of the gate electrode to, and in Schottky contact with, the gate contract region;
wherein the stem section has an upper portion terminating at the top portion of the gate and a bottom portion narrower than the upper portion, the bottom portion terminating at the gate contact region;
wherein the bottom portion the stem has a step between the upper portion of the stem section and the bottom portion of the stem section in only one side of the stem section including a pair of dielectric spacers disposed on sides of the stem section, the pair of dielectric spacers having different etch rates to a predetermined etchant, one of the pair of dielectric spacers being shorter than the other one of the dielectric spacers.

2. The field effect transistor structure recited in claim 1 wherein the shorter one of the dielectric spacers is disposed in the step.

3. A method for forming a field effect transistor structure, comprising:
forming an opening in a first dielectric layer disposed on a surface of a semiconductor to form a first portion of the first dielectric layer over a source region of the semiconductor and a laterally spaced second portion of the first dielectric layer over a drain region of the semiconductor to expose a gate region of the semiconductor between the source region and the drain region;
forming a pair of dielectric sidewall spacers on sidewalls of the opening with a portion of the gate region remaining exposed;
selectively removing an upper portion of only one of the pair of dielectric sidewall spacers wherein one of the pair of sidewall spacers is shorter that the other one of the pair of sidewall spacers; and
forming a gate electrode in Schottky contact with the exposed gate region, the gate electrode having a bottom portion extending laterally between sides of the shorter one of the pair of dielectric sidewall spacers and the other one of the pair of sidewall spacers.

4. A method for forming a field plate for a field effect transistor, comprising:
forming a first dielectric layer over spaced source and drain electrodes and over a gate region portion of a surface of a semiconductor disposed between the spaced source and drain electrodes;
processing the first dielectric layer to form an opening passing between an upper surface portion of the first dielectric and through the first dielectric layer to expose the gate region portion of the surface of the semiconductor, the opening having a pair of spaced sidewalls provided by the processed first dielectric layer;
depositing a conformal dielectric material over upper surface portions of the processed first dielectric layer, over sidewalls portions of the processed first dielectric layer, and over the exposed gate region portion of the surface of the semiconductor;
wherein the conformal dielectric material has a higher etch rate than the etch rate of the first dielectric material to a predetermined anisotropic etchant;
patterning the conformal dielectric material into a pair of dielectric sidewall spacers on the sidewalls of the opening with a portion of the gate region remaining exposed and applying the predetermined etchant to the deposited conformal dielectric material to selectively remove the upper surface portions of the conformal dielectric material exposing underlying portions of the first dielectric layer; and selectively removing the conformal dielectric layer over the gate region portion of the surface of the semiconductor exposing the gate region portion of the surface of the semiconductor; and leaving the conformal material over pair of spaced the sidewalls of the processed first dielectric layer to provide the pair of dielectric sidewall spacers;
photolithographically forming a mask over only the source region portion and a first one of the pair dielectric sidewall spacers while exposing the drain region portion and a second one of the pair dielectric sidewall spacers;
applying a plasma etch to the mask to electrically remove an upper portion of only the second one of the pair of dielectric sidewall spacers while leaving unetched both a lower portion of the second one of the pair of dielectric sidewall spacers and the first one of the pair of dielectric sidewall spacers;
removing the mask;
forming a gate electrode having a portion on the lower portion of the second one of the pair of dielectric spacers to provide a step in only one side of a stem portion of the gate, the step providing the field plate for the transistor.

5. The method recited in claim 4 wherein the gate is a mushroom or T-shaped gate.

6. A field effect transistor structure, comprising:
a semiconductor having a source region, a drain region, and a gate contact region disposed between the source region and the drain region, the source region, the drain region, and the gate contact region disposed on an upper surface of the semiconductor;

a gate electrode having a stem section extending from a top section of the gate electrode to, and in Schottky contact with, the gate contract region, the top section extending laterally beyond the stem section to form a bottom surface of the top section;

wherein the stem section has an upper portion terminating at the bottom surface of the top section of the gate and a bottom portion narrower than the upper portion, the bottom portion terminating at the gate contact region;

wherein the bottom portion the stem has a step in a region between the upper portion of the stem section and the bottom portion of the stem section in only one side of the stem section; and a pair of dielectric spacers, a first one of the pair of dielectric spacers being shorter than a second one of the dielectric spacers, the first one of the dielectric spacers being disposed in the step; and wherein the first one of the pair of dielectric spacers extend from the upper surface of the semiconductor to the step and the second one of the pair of dielectric spacers extends from the upper surface of the semiconductor to the bottom surface of the top section.

7. The field effect transistor structure recited in claim 6 wherein the first one of the pair of dielectric spacers has a different etch rate than the second one of the pair of dielectric spacers to a predetermined etchant.

\* \* \* \* \*